(12) United States Patent
Tuch et al.

(10) Patent No.: US 7,034,531 B1
(45) Date of Patent: Apr. 25, 2006

(54) DIFFUSION MRI USING SPHERICAL SHELL SAMPLING

(75) Inventors: David S. Tuch, Brookline, MA (US); Van J. Wedeen, Somerville, MA (US)

(73) Assignee: The General Hospital Corporation, Boston, MA (US)

( * ) Notice: Subject to any disclaimer, the term of this patent is extended or adjusted under 35 U.S.C. 154(b) by 0 days.

(21) Appl. No.: 10/754,481

(22) Filed: Jan. 9, 2004

Related U.S. Application Data

(60) Provisional application No. 60/438,850, filed on Jan. 9, 2003.

(51) Int. Cl.
*G01V 3/00* (2006.01)
(52) U.S. Cl. ..................................................... 324/309
(58) Field of Classification Search ................ 324/307, 324/309; 600/410, 420
See application file for complete search history.

(56) References Cited

U.S. PATENT DOCUMENTS

| | | | | |
|---|---|---|---|---|
| 4,740,753 A | * | 4/1988 | Glover et al. | 324/320 |
| 4,812,760 A | * | 3/1989 | Bottomley et al. | 324/309 |
| 5,532,595 A | * | 7/1996 | Lampman et al. | 324/309 |
| 5,652,516 A | * | 7/1997 | Adalsteinsson et al. | 324/309 |
| 5,952,827 A | * | 9/1999 | Feinberg | 324/309 |
| 6,185,444 B1 | * | 2/2001 | Ackerman et al. | 600/410 |
| 6,487,435 B1 | * | 11/2002 | Mistretta et al. | 600/420 |
| 6,522,786 B1 | * | 2/2003 | Cline | 382/257 |
| 6,667,618 B1 | * | 12/2003 | Thesen | 324/309 |
| 6,671,536 B1 | * | 12/2003 | Mistretta | 600/410 |
| 2003/0135105 A1 | * | 7/2003 | Jack et al. | 600/410 |

OTHER PUBLICATIONS http://www.springerlink.com/media/5G0484WWQRCWYRL5HH1K/Contibutions/J/D/T/E/JDTEJ4579U74GKAR.pdf.*
http://www.mit.edu/~dtuch/pubs/Neuron-dsi-qball-2003.pdf.*
http://www.ncbi.nlm.nih.gov/entrez/query.fcgi?cmd=Retrieve&db=pubmed&dopt=Abstract&list_uids=15562495.*
http://www.radiology.ucsf.edu/research/visualizing2004.shtml.*
Johns. Fleming et al., Template in Radionuclide Imaging of the lung, pp 1-4.*

* cited by examiner

*Primary Examiner*—Diego Gutierrez
*Assistant Examiner*—Dlxomara Vargas
(74) *Attorney, Agent, or Firm*—Daly, Crowley, Mofford & Durkee, LLP

(57) ABSTRACT

A diffusion MRI technique that employs a sampling/reconstruction scheme that samples the diffusion signal directly on the sphere and reconstructs the diffusion function directly on the sphere is presented.

23 Claims, 8 Drawing Sheets

DIFFUSION MRI USING SPHERICAL SHELL SAMPLING

CROSS REFERENCE TO RELATED APPLICATIONS

This application claims the benefit of U.S. Provisional Patent Application No. 60/438,850, filed Jan. 9, 2003, under 35 U.S.C. § 119(e) and is incorporated herein by reference in its entirety for all purposes.

STATEMENT REGARDING FEDERALLY SPONSORED RESEARCH

This invention was made with government support under Grant Number 1R01MH64044 awarded by the National Institutes of Health (NIH). The government has certain rights in the invention.

BACKGROUND

The invention relates generally to diffusion magnetic resonance imaging (MRI).

As is known in the art, diffusion MRI provides a relatively sensitive probe of tissue microstructure. Owing to the microscopic length scale of diffusion in biological tissues, diffusion imaging can reveal histological architecture irresolvable by conventional MRI methods.

One known method of measuring neural connectivity noninvasively using a diffusion MRI technique is diffusion tensor imaging (DTI). DTI measures the molecular diffusion of water along neural pathways. Accurate reconstruction of neural connectivity patterns from DTI has been hindered, however, by the inability of DTI to resolve more than a single axon direction within each imaging voxel.

DTI measures the molecular diffusion, that is, the random thermal motion, of the endogenous water in brain tissue. The reconstruction of neural connectivity patterns from DTI is based on the phenomenon of diffusion anisotropy in nerve tissue: water molecules diffuse relatively freely along the neural fiber direction, but are hindered in the fiber-transverse direction. The hindrance of water diffusion in white matter is putatively due to the diffusion barrier presented by the cell membrane and the myelin sheath.

By measuring the direction of the diffusion anisotropy within each voxel, DTI provides an estimate of the neural fiber direction within each voxel. The resulting image represents a three-dimensional vector field image of the neural fiber orientation. The so-called tractography problem entails computationally reconstructing neural pathways from the diffusion tensor vector field. Reconstruction of neural pathways from DTI is confounded however by the limitation that DTI can only resolve a single fiber direction within each voxel. At the millimeter scale of the MR voxel, there is typically a distribution of fiber orientations within each voxel. For example, intravoxel orientational heterogeneity may arise from intersections between white matter bundles as well as the complex arrangement of fiber orientations at the cortical surface.

If there are multiple fiber orientations within a voxel, for example, due to fibers crossing or diverging within the voxel, DTI will estimate the fiber orientation to be the mean of the underlying fiber directions. The mean direction will not be representative of the true fiber directions, however. To consider an example, if one fiber points vertically and another fiber points horizontally, then the mean fiber direction will point towards the diagonal, differing from either of the underlying fiber directions. The inability to resolve multiple intravoxel fiber directions with DTI represents a substantial barrier to accurate mapping of white matter connectivity.

The inability of DTI to resolve multiple fiber directions stems from the assumption of Gaussian diffusion inherent to the tensor model. The tensor model assumes Gaussian diffusion and a Gaussian function only has a single directional maximum. Consequently, the tensor model cannot capture multidirectional diffusion. Recently, it has been shown that in brain regions containing fiber crossing the MR diffusion signal has significant multimodal structure, in clear disagreement with the tensor model.

In an effort to resolve the fiber-crossing confound in DTI, investigators have introduced more elaborate models of the diffusion process in neural tissue. However, the model-based approaches require a number of assumptions. The mixture modeling approach, for example, assumes that each fiber population contains Gaussian diffusion, and that there is no water exchange between fiber populations.

A model-independent approach would not need to assume a single diffusion direction and would therefore be able to detect possible fiber crossing structure. The diffusion function can be imaged model-independently using another diffusion MRI technique referred to generally as the Cartesian technique, an example of which is "q-space imaging". The Cartesian technique measures the full three-dimensional diffusion function directly without any assumptions on the form of the underlying diffusion function. Thus, in contrast to DTI, it can resolve multiple fiber directions within a single voxel. One problem with the Cartesian technique, however, is that the Cartesian technique requires relatively long scanning times and fairly elaborate image post-processing.

SUMMARY

In one aspect of the invention, a method of imaging a microscopic structure includes: (i) receiving magnetic field gradient directions specified for an MRI scan of a microscopic structure; (ii) generating images for each magnetic field gradient direction; (iii) collecting pixel information from the generated images for a given pixel of interest; (iv) assembling the pixel data onto a surface of at least one sphere; and (v) determining properties of a diffusion function on the at least one sphere by transforming the pixel data assembled onto the surface of the at least one sphere using a spherical transform.

Particular implementations of the invention may provide one or more of the following advantages.

With this particular mechanism, an imaging technique capable of measuring the microscopic diffusion function within each voxel is provided. In contrast to previous approaches to diffusion imaging, the technique does not require any assumptions on the underlying diffusion function. Such a model-independent approach can thus resolve complex intravoxel tissue structure including fiber crossing and fiber divergence within a single voxel. The technique is capable of resolving not only deep white matter intersections, but also composite tissue structure at the cortical margin, and fiber-specific degeneration in neurodegenerative pathology. The technique can thus reveal complex intravoxel tissue structure previously thought to be beyond the scope of diffusion imaging methodology.

The technique of the present invention also increases the acquisition efficiency and sensitivity of diffusion MRI relative to prior techniques. This allows the signal acquisitions to be spent more efficiently on angular resolution.

The spherical sampling and reconstruction technique of the present invention provides a more natural framework for describing angular resolution. Whereas the angular resolution of a spherical sampling scheme is upper-bounded by the angular distance between the sampling points, it is not clear how to define angular resolution in the context of Cartesian sampling. Additionally, with spherical sampling the acquisition can be targeted to the spatial frequency band where the angular contrast-to-noise is greater. Also the technique of the present invention can be adapted to length scales of interest by adjusting the radius of the sphere onto which the pixel values are assembled.

Other features and advantages of the invention will be apparent from the following detailed description, and from the claims.

DETAILED DESCRIPTION

Figure 1:
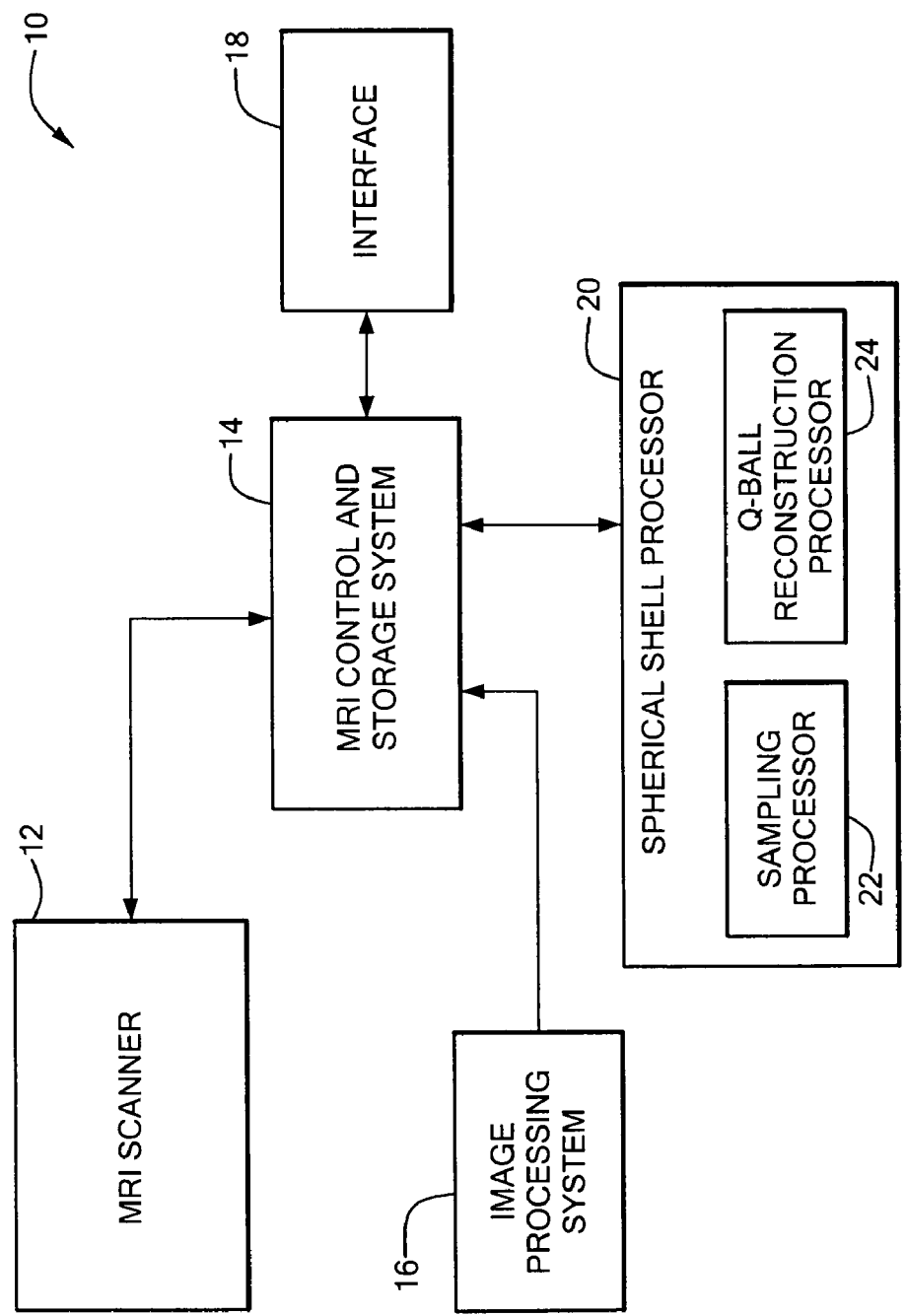
FIG. 1 shows a block diagram of an MRI scanner system.

The connectivity anatomy of the human brain remains poorly understood, largely due to the lack of a diffusion MRI tool that is effective in terms of resolving complex structure but is also practical for routine investigative purposes. Such a tool would provide invaluable information on how human cerebral cortex communicates and integrates information across disparate processing areas, and would also enable clinical diagnosis of connectivity disorders on an individual subject basis.

As mentioned above, it is possible to directly measure the microscopic three-dimensional diffusion function within each voxel of the MR image using q-spacing imaging methods. The diffusion function (or spin displacement probability density function), denoted as P(r), describes the probability for a water molecule to undergo a displacement r in the experimental diffusion time r. Q-space imaging methods exploit the Fourier relationship between the diffusion function P(r) and the diffusion MR signal E(q). That Fourier relationship can be written explicitly as $$P(r)=F[E(q)] \quad \text{Eq. 1}$$

where:
- $q=\gamma\delta g$ is the experimental diffusion wavevector (also referred to as the spin displacement wavevector);
- F is the Fourier transform (FT) with respect to the experimental diffusion wavevector q;
- r is the relative spin displacement in the experimental diffusion time $\tau$;
- $\gamma$ is the nuclear gyromagnetic ratio for water protons;
- $\delta$ is the diffusion gradient duration; and
- g is the diffusion-encoding magnetic field gradient.

Based on the Fourier relationship between the diffusion function and the diffusion MR signal, the diffusion function can be directly reconstructed by Fourier transform of the diffusion signal.

Using a technique such as Diffusion Spectrum Imaging (DSI), a variant of q-space imaging, it is thus possible to obtain a direct measurement of the three-dimensional diffusion function in the human brain. Specifically, the diffusion function within each voxel is reconstructed by sampling the diffusion signal on a Cartesian grid and then taking the Fourier transform on the grid. In order to visualize and analyze the diffusion function, the diffusion function is projected onto the sphere. The resulting function is referred to as a diffusion orientation distribution function (ODF) or simply, ODF. The radial projection used to construct the diffusion ODF discards all of the radial information contained in the diffusion function. Hence, the diffusion ODF does not contain the radial information originally present in the Cartesian diffusion function, but preserves the salient angular contrast. This approach provides an increase in spatial sensitivity of diffusion MRI over other conventional diffusion imaging techniques.

By measuring the diffusion function directly, DSI can resolve multiple fiber directions within a single voxel and therefore eliminates the fiber crossing confound in diffusion imaging. However, measuring the complete three-dimensional diffusion function requires long acquisition times and strong magnetic field gradients. The long acquisition times and gradient hardware demands have limited the routine implementation of q-space imaging methods such as DSI on conventional MR scanners.

According to the present invention, therefore, a diffusion imaging technique, termed "q-ball imaging" (QBI), is provided that is capable of resolving complex, subvoxel neural architecture, and is model-independent and considerably more time-efficient than current q-space imaging methods. The efficiency gain is achieved by selectively measuring the angular structure of the diffusion function. By selectively measuring the angular structure of the diffusion function, it is still possible to resolve complex structure, yet the acquisition time is significantly reduced and the demands on the magnetic field gradients are also substantially reduced. The boost in sampling efficiency stems from the need to sample the diffusion signal only on a spherical shell as opposed to a complete three-dimensional Cartesian grid. The reduced gradient requirements follow from the need to sample only a single spatial frequency, i.e., the radius of the sampling sphere, instead of exhaustively sampling the high spatial frequencies necessary to satisfy the Nyquist condition. While the three-dimensional diffusion function provides invaluable information on the tissue microstructure, for the purposes of mapping neural fiber orientation, the angular structure of the diffusion function can capture much of the salient contrast.

'Angular structure' specifically means the radial projection of the diffusion function, that is, the function obtained by integrating the diffusion function over the radial dimension. The resulting spherical function is the diffusion ODF. The diffusion ODF is defined specifically as $$\psi(u) = \int_0^\infty P(ru)\, dr \qquad \text{Eq. 2}$$

where:
- u is a unit direction vector, describes the probability for a water molecule to diffuse any distance in the direction u in the experimental diffusion time $\tau$;
- r is the radial coordinate in the diffusion space coordinate system; and
- $\psi$ corresponds to the diffusion function (ODF).

The ODF captures the relevant angular contrast of the diffusion function, and, unlike the diffusion tensor, is capable of describing multimodal diffusion. In particular, the ODF can describe the complex diffusion patterns which arise from intravoxel fiber crossing. The QBI technique can resolve complex subvoxel histoarchitecture including white matter fiber crossing and divergence within individual imaging voxels. Further, by varying the magnitude of the applied diffusion-sensitizing magnetic field gradient it is possible to sensitize the diffusion signal to length scales on the order of tens of microns.

In the DSI method, as discussed earlier, the ODF is reconstructed by sampling the diffusion signal on a Cartesian grid, Fourier transformation, and then radial projection. In contrast, in the QBI method, sampling of the diffusion signal occurs directly on the sphere and then the ODF is reconstructed directly on the sphere. The spherical inversion is accomplished with the Funk-Radon transform (FRT), also known as the spherical Radon transform, as will be described later. Because the QBI diffusion MRI technique resolves complex intravoxel fiber architecture, does not rely on analytical models of the underlying diffusion process and does not require long scanning times and elaborate post-processing of images, it significantly facilitates non-invasive mapping neural connectivity in the human brain.

Referring now to FIG. 1, a magnetic resonance imaging (MRI) system 10 configurable to perform the QBI method is shown. The MRI system 10 includes an MRI scanner 12 that includes a magnet having gradient coils and RF coils disposed thereabout in a particular manner to provide a magnet system. In response to control signals provided from a controller processor, a transmitter provides a transmit signal to the RF coil through an RF power amplifier. A gradient amplifier provides a signal to the gradient coils also in response to signals provided by a control system 14.

The magnet system is driven by the transmitter and amplifiers. The transmitter generates a steady magnetic field and the gradient amplifier provides a magnetic field gradient which may have an arbitrary direction. For generating a uniform, steady magnetic field required for MRI, the magnet system may be provided having a resistance or superconducting coils and which are driven by a generator. The magnetic fields are generated in an examination or scanning space or region in which the object to be examined is disposed. For example, if the object is a person or patient to be examined, the person or portion of the person to be examined is disposed in the scanning region.

The transmitter/amplifier drive the coil. After activation of the transmitter coil, spin resonance signals are generated in the object situated in the examination space, which signals are detected and are applied to a receiver. Depending upon the measuring technique to be executed, the same coil can be used for the transmitter coil and the receiver coil or use can be made of separate coils for transmission and reception.

The detected resonance signals are sampled, digitized in a digitizer. Digitizer converts the analog signals to a stream of digital bits that represent the measured data and provides the bit stream to the control system 14 for storage and/or further processing.

The control system 14 processes the resonance signals measured so as to obtain an image of the excited part of the object. An image processing system 16 is coupled to the control system 14 and can be used to display the reconstructed image. The display may be provided for example as a monitor or a terminal, such as a CRT or flat panel display.

A user provides scan and display operation commands and parameters to the control system 14 through an interface 18 which provides means for a user to interface with and control the operating parameters of the MRI system 10 in a manner well known to those of ordinary skill in the art. The control system 14 is used, among other things, to specify magnetic field gradient directions for each scan and to generate images for each magnetic field gradient direction.

The control system 14 also has coupled thereto a spherical shell processor 20 that includes a sampling processor 22 and a Q-ball reconstruction processor 24. Each of the components depicted in FIG. 1, except for the spherical shell processor 20, are standard equipment in commercially available MRI systems. It should be appreciated that the MRI system must be capable of acquiring the data to be used by the spherical shell processor 20 in the manner to be described hereinbelow.

In some embodiments, the spherical shell processor 20 may be provided as a general purpose processor or computer programmed in accordance with the techniques described herein to compute one or more ODFs and to generate a corresponding spherical polar plot.

For example, in some applications it may be desirable to provide a single processor or computer which is appropriately programmed to perform the functions of control system 14 and the spherical shell processor 20. In other embodiments, the image processing system 16 and the spherical shell processor 20 may be provided as specially designed processors (e.g. digital signal processors) or other specially designed circuits.

The particular processing performed by the spherical shell processor 20 will be described in detail further below. Suffice it here to say that the spherical shell processor 20 is unique in that it is programmed or otherwise designed to assemble pixel data onto a spherical surface and to calculate a spin displacement orientation distribution function (ODF) using a spherical Radon transform.

Figure 2:
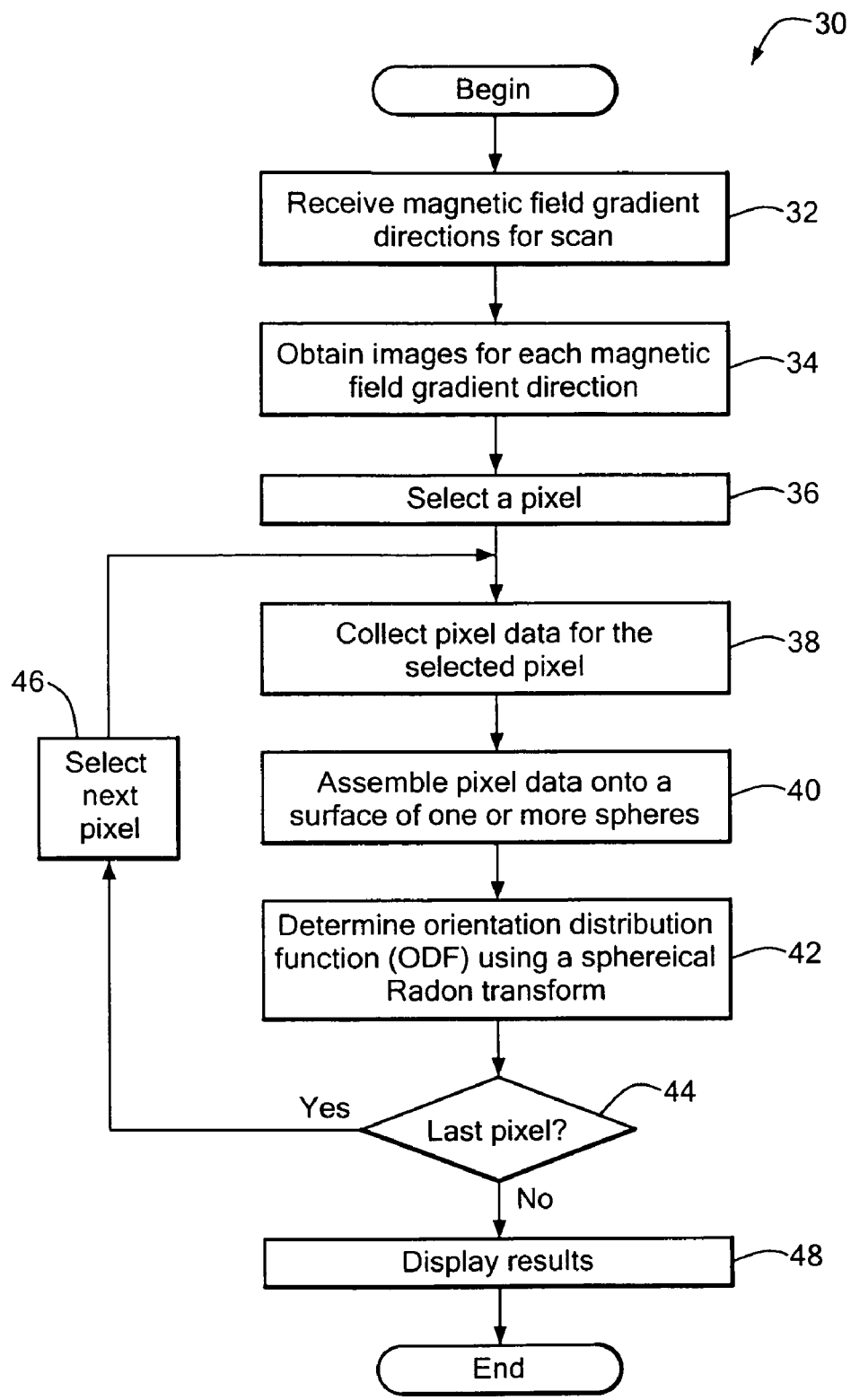
FIG. 2 shows a flow diagram of an exemplary spherical shell sampling and reconstruction ("q-ball imaging" or "QBI") that visualizes microscopic structure diffusion MRI measurements in multiple directions.
Figure 3:
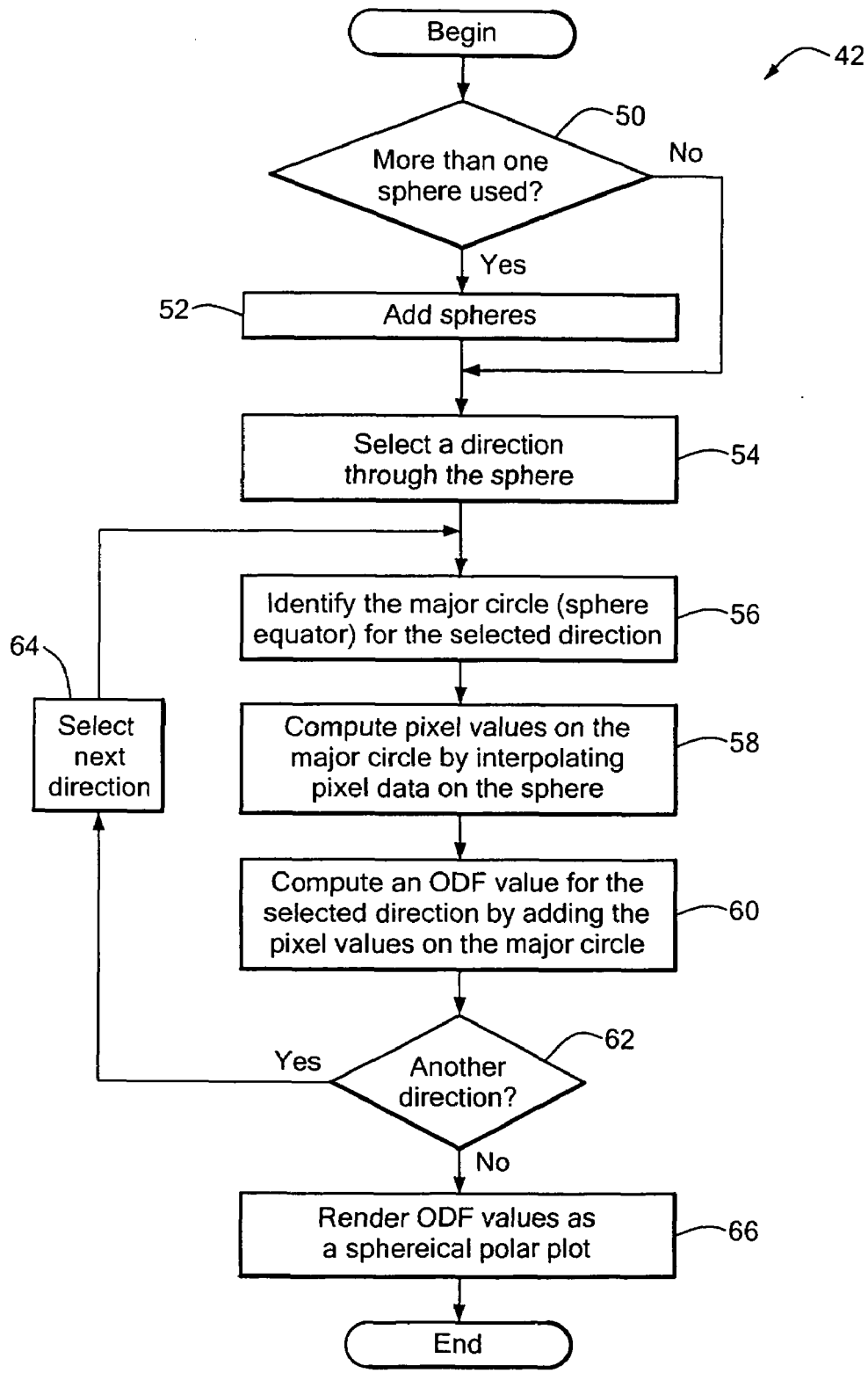
FIG. 3 shows a flow diagram of a reconstruction portion of the QBI method of FIG. 2.

FIGS. 2 and 3 are a series of flow diagrams that show the processing of the QBI mechanism. The processing is performed by a processing apparatus which may, for example, be provided as part of an MRI system such as that shown in FIG. 1 to generate a spherical polar plot. The rectangular elements in the flow diagram are herein denoted "processing blocks" and represent computer software instructions or groups of instructions. The diamond shaped elements (typified by element 38), herein denoted "decision blocks," represent computer software instructions, or groups of instructions that affect the execution of the computer software instructions represented by the processing blocks.

Alternatively, the processing blocks represent steps performed by functionally equivalent circuits such as a digital signal processor circuit or an application specific integrated circuit (ASIC). It should be appreciated that some of the steps described in the flow diagram may be implemented via computer software while others may be implemented in a different manner e.g. via an empirical procedure. The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit of the invention.

Turning now to FIG. 2, QBI processing 30 begins in step 32 in which one or more magnetic field gradient directions specified by a user for an MRI scan are received. In one exemplary embodiment, 492 different magnetic field gradient directions are selected.

In step 34 images are then generated (or more properly, data from which images can be generated are acquired) for each of the specified magnetic field gradient directions. In step 36 a pixel is selected, and then pixel data (for the selected pixel) is collected and then assembled onto a surface of one or more spheres as shown in steps 38 and 40.

Processing then proceeds to step 42 where properties of the diffusion function on the one or more spheres are determined using a spherical transform. In the illustrated embodiment, the properties of the diffusion function on the sphere(s) refers to the ODF and the spherical transform that is used is the FRT (introduced above). Other properties such as functions on the radial projection, e.g., higher moments of the radial projection and orientation anisotropy measures, could be used as well.

Processing steps 38, 40 and 42 are then repeated for each additional pixel of interest, as indicated by steps 44 and 46. Once all (or a desired number of pixels but less than all pixels) are processed, a spherical polar plot can be displayed (step 48).

Referring now to FIG. 3, the processing details involved in the ODF determination or calculation (step 42 in FIG. 2) are shown. The processing begins in step 50 by determining if more than one sphere was used. If more than one sphere was used, the processing combines the spheres into one sphere by adding corresponding pixel data on the spheres (step 52). The processing selects a direction through the sphere (step 54). In step 56, the major circle (that is, the equator of the sphere, also referred to as "the great circle") for the selected direction is identified. In step 58, pixel values on the major circle are computed by interpolating pixel data on the sphere. The interpolation can be performed using one of a number of various known techniques, such as Parzen window interpolation, spherical radial basis function interpolation and spherical spline interpolation. An example of a Parzen window interpolation with a Gaussian kernel is described below. Once the pixel values on the major circle have been computed for the selected direction, those pixel values are added together (step 60). At step 62, it is determined if another direction is to be selected for processing. If so, the processing proceeds to step 64 in which the next direction is selected. Otherwise, if there are no other directions to be included in the processing, then at step 66 the resulting ODF is rendered as a spherical polar plot. Other visualization techniques can be employed as well. For example, the diffusion measurements represented in the spherical polar plot could instead be represented by simple geometric icons, for example, lines or arrows, to reduce processing overhead associated with the more graphics-intensive spherical polar plot rendering.

Figure 4:
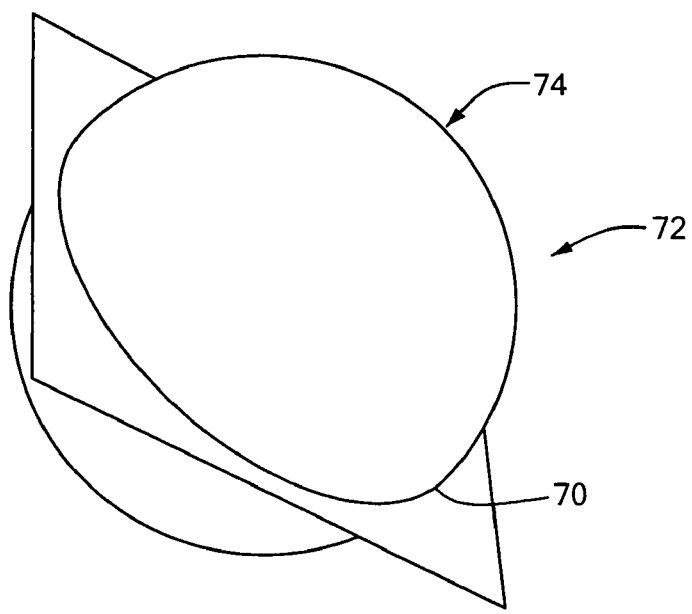
FIG. 4 shows a depiction of a Funk-Radon transform to a sphere according to one embodiment of the QBI method of FIGS. 2 and 3.

For a given point on the sphere, referred to herein as a pole, the FRT assigns the value at the pole to be the integral over the associated equator. With reference to FIG. 4, the FRT assigns the integral over an equator (or major circle) 70 of a sphere 72 to the value at a corresponding pole (indicated by reference numeral 74).

How to measure the angular structure of an object in Fourier space will now be addressed. In the context of the MR experiment, the MR diffusion signal E is related to the diffusion function P by the Fourier relation of Eq. 1. The orientational structure of the diffusion can be extracted from P by integrating over the radius of the function. The radial projection of the diffusion function is the ODF, defined in Eq. 2 above. The ODF gives the probability for a spin to diffuse any distance in the direction u at the experimental diffusion time τ. The ODF is a probability function defined on the sphere. The ODF is symmetric about reflection $\psi(u)=\psi(-u)$ due to the reflection symmetry of the PDF, i.e., $P(r)=P(-r)$, which in turn is a consequence of microscopic detailed balance.

Given E(q) sampled on a sphere of radius q', how can one reconstruct the ODF? As shown below, one can obtain an approximation to the true ODF by computing the FRT of the diffusion signal.

The FRT, denoted as S, is an integral transform from the sphere to the sphere. The FRT is sometimes referred to as the spherical Radon transform or simply the Funk transform. Consider a function p(w) on the sphere, where w is a unit direction vector. For a given direction of interest u, the FRT is defined as the integral over the corresponding equator:

$$S[p(w)]=\int_{w\perp u}p(w)dw. \qquad \text{Eq. 3}$$

The relationship between FRT of the diffusion signal and the diffusion ODF can be formulated most easily in cylindrical coordinates. The diffusion signal and the diffusion PDF are written in cylindrical coordinates as, respectively, $E(q_r,q_\theta,q_z)$ and $P(r,\theta,z)$. Without loss of generality, take the direction of interest u to be the z direction. For a three-dimensional function, the FRT can be defined as the FRT evaluated at a particular radius, say, q'. The FRT of E at a wavevector radius q' can be written in cylindrical coordinates as $$S_{q'}[E]=\int E(q',q_\theta,0)dq_\theta=\int E(q_r,q_\theta,0)\delta(q_r-q')q_r \, dq_r dq_\theta dq_z \qquad \text{Eq. 4}$$

Using Plancherel's theorem $$\int f(x)g^*(x)dx=\int F[f(x)]F^*[g(x)]dk \qquad \text{Eq. 5}$$

and the central slice theorem $$F[E(q_r,q_\theta,0)]=\int P(r,\theta,z)dz \qquad \text{Eq. 6}$$

gives $$S_{q'}[E]=2\pi q'\int P(r,\theta,z)J_0(2\pi q'r)r \, dr \, d\theta \, dz=2\pi q'\int H[P(r,\theta,z)] \, d\theta dz, \qquad \text{Eq. 7}$$

where $F[\delta(q_r-q')]=2\pi q'J_0(2\pi q'r)$, $J_0$ is the zeroth order Bessel function and H denotes the Hankel transform $H[f(r)]=\int f(r)J_0(2\pi kr)r \, dr$. Eq. 7 can also be derived without Plancherel's theorem using a cylindrical wave expansion.

From Eq. 7 it can be seen that for a direction of interest z, the FRT of the diffusion signal is proportional to the mass of the Hankel transform of the PDF projected on the rθ-plane. To the degree that the mass of $J_0$ is concentrated at the origin, the ODF obtained by FRT approximates the true ODF obtained by radian projection (RP). If the Bessel function is replaced by a delta function $\delta(r)$ in Eq. 4, then one obtains the RP exactly. Thus, summing over a circle in Fourier space is approximately equal to summing the signal along the direction normal to the circle in real space. Due to the Fourier relationship between the diffusion MR signal and the diffusion function, it is possible to exploit this finding to measure the diffusion probability in a particular direction by simply summing the diffusion MR signal along an equator around that direction.

The radius of the sampling sphere q' controls the width of the Bessel function (~1/q') which in turn controls the angular resolution. Increasing q' sharpens the Bessel kernel and increases the ability to resolve distinct peaks. Less signal will pass through the projection kernel however, and the signal-to-noise ratio will decrease. Conversely, decreasing q' widens the Bessel kernel and reduces the power to discriminate peaks, but increases the signal-to-noise ratio. The sampling radius wavevector q' controls the tradeoff between the sharpness and the mass of the projection kernel, which determines the tradeoff between angular resolution and the signal-to-noise ratio.

Further details of the FRT may be had with reference to the following: a paper by P. Funk, entitled "Uber eine geometrische Anwendung der Abelschen Integralgleichnung," Math. Ann. 77, 129–135 (1916); and a paper by S. Helgason, entitled "The Radon Transform," Volume 5, Boston: Springer-Verlag (1999), incorporated herein by reference.

To evaluate the sensitivity of the QBI method, experiments were performed to compare QBI data obtained with two different diffusion wavevectors to DSI. One diffusion spectrum image (Experiment A) and two q-ball images (Experiments B and C) were acquired on a healthy volunteer on a 3T Siemens Allegra scanner. Experiment A provided a standard DSI image for comparison purposes, and Experiments B and C provided, respectively, a lower and higher spatial frequency q-ball acquisition. All three experiments used a twice-refocused spin echo pulse sequence although the imaging parameters and sampling schemes differed. The slice prescription for all three experiments was identical and consisted of two coronal slices with a 2.8 mm slice thickness and a 6.72 mm slice gap. Whole-head structural images (3D MPRAGE) were also acquired for anatomical reference. For all three experiments, one image with no diffusion weighting was also acquired. A fourth set of data was reconstructed from the average of the low and high frequency QBI data sets.

The imaging parameters for the DSI experiment (Experiment A) were TR/TE/$\Delta$/$\delta$=800/143/66/61 ms, $b_{max}$=1.7×10$^4$ s/mm$^2$. Five hundred fifteen (515) q-space points were sampled on a keyhole Cartesian grid with $g_{max}$=40 mT/m and $q_{max}$=1050 cm$^{-1}$. The q-space sampling scheme consisted of a spherically truncated Cartesian lattice, i.e., the points on a N×N×N Cartesian lattice which lie within a sphere of diameter of N. The lattice dimension was N=11, giving n=515 q-space sampling points. This encoding gives lattice width 2$q_{max}$=2100 cm$^{-1}$, lattice spacing $\Delta q$=2$q_{max}$/(N-1)=210 cm$^{-1}$, spatial resolution (2$q_{max}$)$^{-1}$=4.76 μm, and FOV($\Delta q$)$^{-1}$=47.69 μm.

Figure 5:
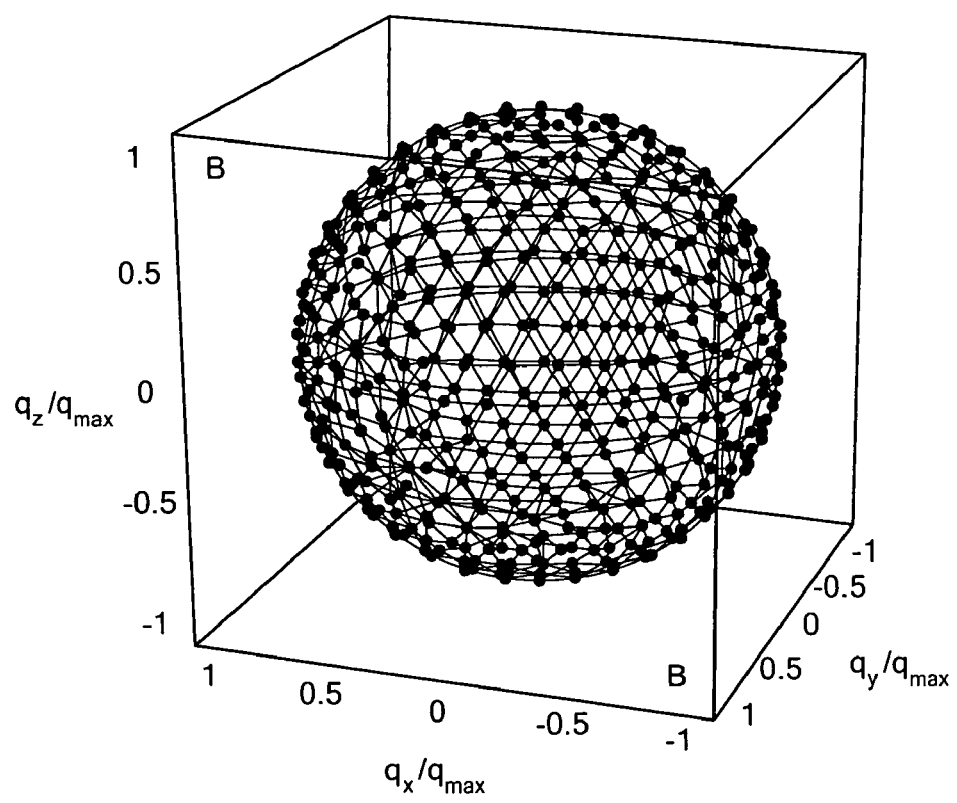
FIG. 5 shows a representation of exemplary QBI parameters, specifically, gradient directions obtained from the vertices of a seven-fold tessellated icosahedron.

With reference to FIG. 5, for both q-ball experiments (Experiments B and C), the QBI acquisitions consisted of a 'low-frequency' acquisition (q=670 cm$^{-1}$, b=4×10$^3$ s/mm$^2$) and a 'high-frequency' acquisition (q=950 cm$^{-1}$, b=1.2×10$^4$ s/mm$^2$). The q-space sampling were obtained from n=492 vertices of a 7-fold tessellated icosahedron, which gives an angular resolution of 9.30°.

Thus, FIG. 5 shows the magnetic field gradient directions for the QBI experiment. The magnetic field gradient directions were obtained from the 492 vertices of the 7-fold tessellated icosahedron. This scheme gives an average minimum angular distance between points of 9.30±0.76 degrees. The sequence parameters for the first q-ball experiment (Experiment B) were TR/TE/$\Delta$/$\delta$=800/98/44/39 ms, $b^{max}$=4.0×10$^3$ s/mm$^2$, $g_{max}$=40 mT/m, q=670 cm$^{-1}$, and the parameters for the second q-ball experiment (Experiment C) were TR/TE/$\Delta$/$\delta$=800/130/60/55 ms, $b_{max}$=1.2×10$^4$ s/mm$^2$, $g_{max}$=40 mT/m, q=950 cm$^{-1}$.

The DSI data were reconstructed and visualized according to techniques described below. The q-ball data were reconstructed using the FRT, which was implemented in practice as follows.

For the DSI acquisition, the ODF for each voxel was reconstructed by zero-filling the diffusion signal lattice, computing the fast FT, and then the RP. The RP was calculated using cubic spline interpolation with $r_{max}$=FOV/2=23.85 μm. The RP was evaluated for m=752 directions which were obtained from the vertices of a 5-fold tessellated dodecahedron. Each ODF was then normalized to unit mass.

For the QBI, the ODF was calculated for each voxel using the FRT: $\psi(u)=\int_{q\perp u}E(q)dq$, where u is the diffusion direction of interest. The ODF was evaluated for m=752 directions corresponding to the vertices of a 5-fold tessellated dodecahedron. The FRT was computed using spherical radial basis function interpolation with a spherical Gaussian kernel ($\sigma$=12.0°). The reconstructed ODFs were then smoothed with a spherical Gaussian kernel ($\sigma$=13.2°), and normalized to unit mass. The ODF peaks were defined as local maxima of the ODF with amplitude greater than the ODF mean for each voxel. For both the DSI and QBI acquisitions, the generalized fractional anisotropy (GFA) was calculated as GFA=std($\psi$)/rms($\psi$) where std is the standard deviation and rms is the root-mean-squared. The diffusion tensor D was calculated for each voxel using a noise-whitened least-squares fit to the diffusion signal.

Figure 6:
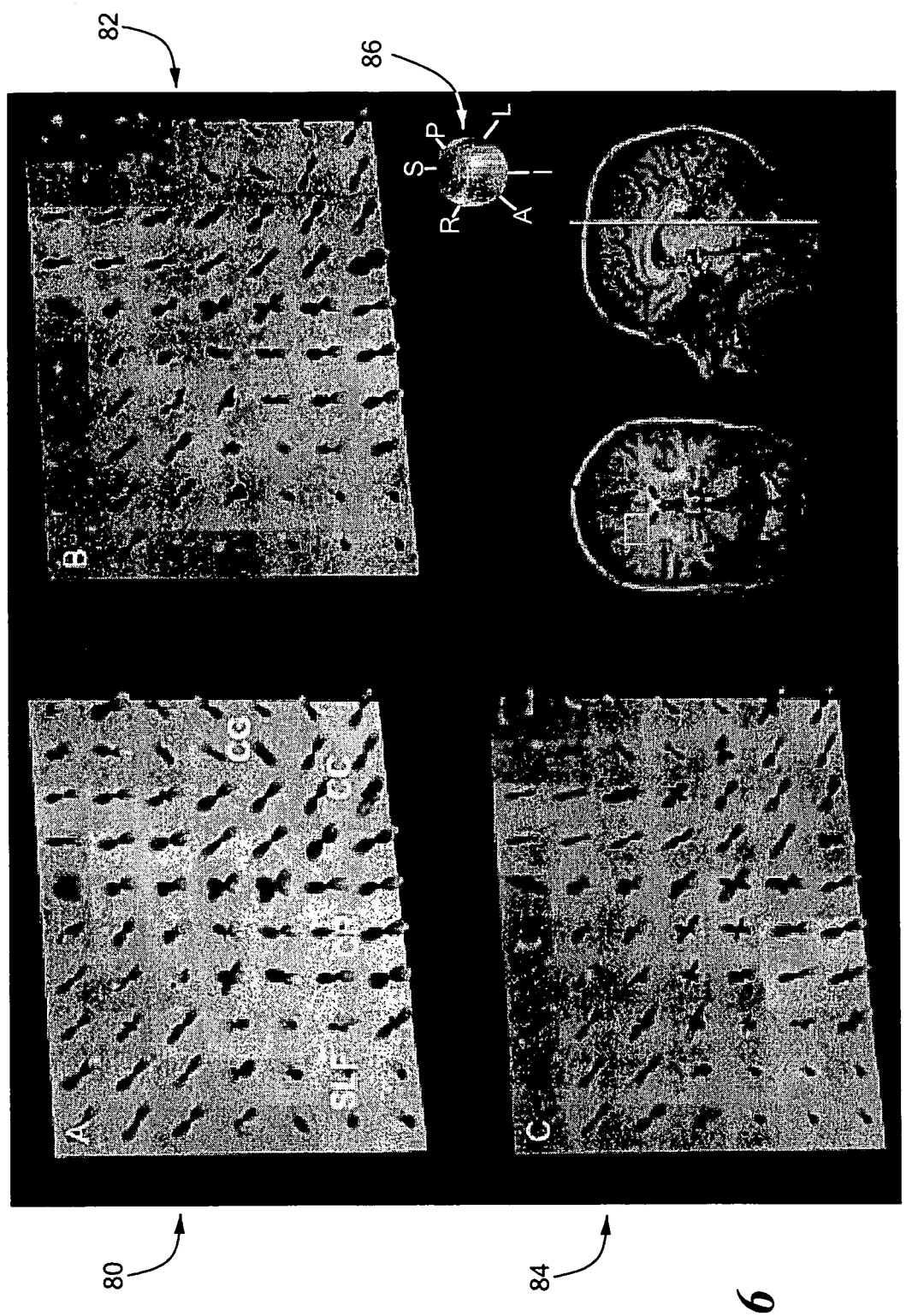
FIG. 6 shows coronal diffusion orientation distribution function (ODF) maps for results of diffusion spectrum imaging (DSI) and QBI.

In regions of anatomic fiber crossing, both DSI and QBI resolved fiber-crossing structure within individual voxels. FIG. 6 shows a first ODF map obtained from Experiment A for a DSI image (indicated by reference numeral 80), a second ODF map obtained from Experiment B for a low frequency q-ball image (indicated by reference numeral 82) and a third ODF map obtained from Experiment C for a high frequency q-ball image (indicated by reference numeral 84). The images are sagittal slices taken from the crossing of the corona radiata (CR) with the superior longitudinal fasciculus (SLF) and the striations of the corpus callosum (CC). ODFs with multimodal structure are seen where the projections from the CC intersect the SLF, and where the projections from the CC intersect the CR. Unimodal diffusion is seen in voxels where the fibers are homogeneously aligned within a voxel, such as in the body of the CC and in the CR inferior to the intersection with the striations from the CC.

The high frequency QBI image 84 reveals additional anatomical structure not evident in the ODF maps of either the DSI or the low frequency QBI. In the high frequency QBI, the callosal striations interdigitate the CR over a wider area and exhibit a more uniform density compared to the sparse appearance of the intersections in the DSI and low frequency QBI. The interdigitation of the CC and the cingulate gyrus (CG) are clearly resolved in the high frequency QBI. The diffusion peaks for the high frequency QBI were sharper than those of the low frequency QBI or DSI.

The region of interest (ROI) and anteroposterior level are shown in the MPRAGE images at bottom right. The ROI depicts the intersection of the CR with the projections between the CC and the motor cortex. The ODF for each voxel is depicted as a spherical polar plot. For visualization purposes, each ODF has been min-max normalized. The orientation of the fibers of the ODF are indicated by a sphere (indicated by reference numeral 86). It will be appreciated that the ODFs may be color-coded according to a red-green-blue colored sphere, with red indicating mediolateral, green anteroposterior and blue superoinferior. The brightness over the ODF may be scaled by the ODF amplitude. The background image, typically grayscale, is the sum of all the diffusion-weighted images for a particular experiment.

Figure 7A:
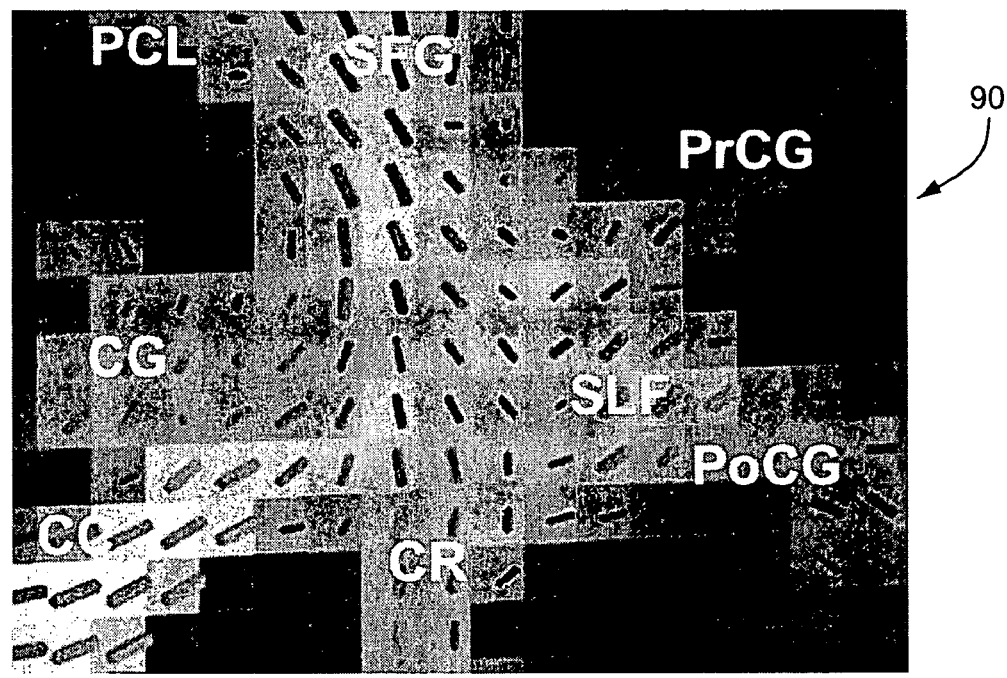
FIGS. 7A–7B show diffusion tensor imaging (DTI) and low frequency QBI ODF maps rendered as cuboid fields.
Figure 7B:
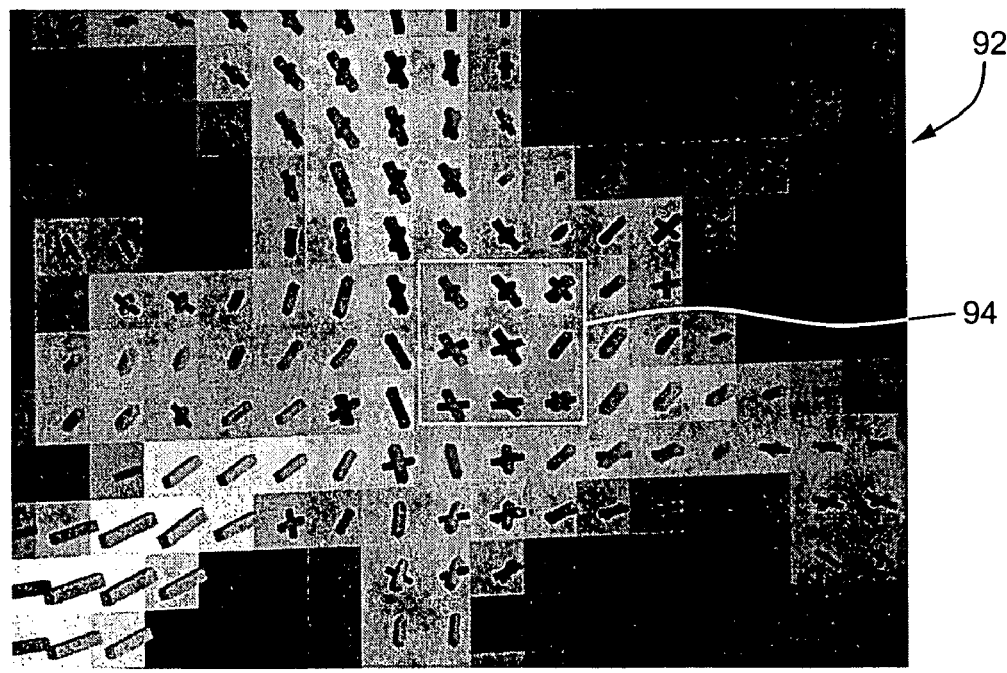

FIGS. 7A–7B show a comparison of the DTI and low frequency QBI results. The DTI and low frequency QBI were reconstructed from the same acquisition. FIG. 7A shows the DTI map rendered as a cuboid field 90. Each cuboid is oriented in the direction of the principal eigenvector of the local diffusion tensor (that is, the diffusion tensor within that voxel). The region containing the three-way intersection between the CR, SLF and projections from the CC shows only the CR projections. In contrast, and referring to FIG. 7B, which shows the QBI rendered as a multi-cuboid field 92 (where the cuboids represent the peaks of the ODF within that voxel), the three-way crossing between the CC, CR and SLF are resolved. The cuboids may be color-coded according to the RGB scheme described above, and may be scaled by fractional anisotropy (FA) for the DTI map and by generalized fractional anisotropy (GFA) for the QBI map.

Comparing the DTI and the QBI, it is observed that on the DTI (FIG. 7A), only the CR is apparent. In contrast, the QBI shows the three-way crossing between the ascending projections of the CR, the SLF, and the striations of the CC. On the DTI, the callosal striations as well as the SLF are obscured by the CR. The dominance of the CR over the callosal projections and the SLF on the DTI is likely due to the higher anisotropy of the CR bundle.

The callosal striations are not observable on the DTI and consequently the callosal fibers appear to project only to the superior frontal gyrus. Additionally, the precentral and postcentral gyri appear to have no connections. Further, the SLF is obscured by the CR and appears discontinuous. In contrast, QBI (FIG. 7B) resolved the striations of the CC to superior frontal gyrus (SFG), precentral gyrus (PrCG), postcentral gyrus (PoCG), and paracentral lobule (PCL), against the background of the CR and SLF projections. The three-way crossing between the SLF, the CC, and the projections from the CC is shown in more detail in FIG. 8.

In the cingulate gyrus, QBI resolved the ascending projections to the superior lobe of the cingulate gyrus through the core anteroposterior-directed cingulum bundle. On the DTI, the ascending projections to the superior lobe of cingulate gyrus are not detectable. The minor anteroposterior-directed fibers seen in the superior lobe of the cingulate gyrus may be fibers from the main cingulum bundle.

Figure 8:
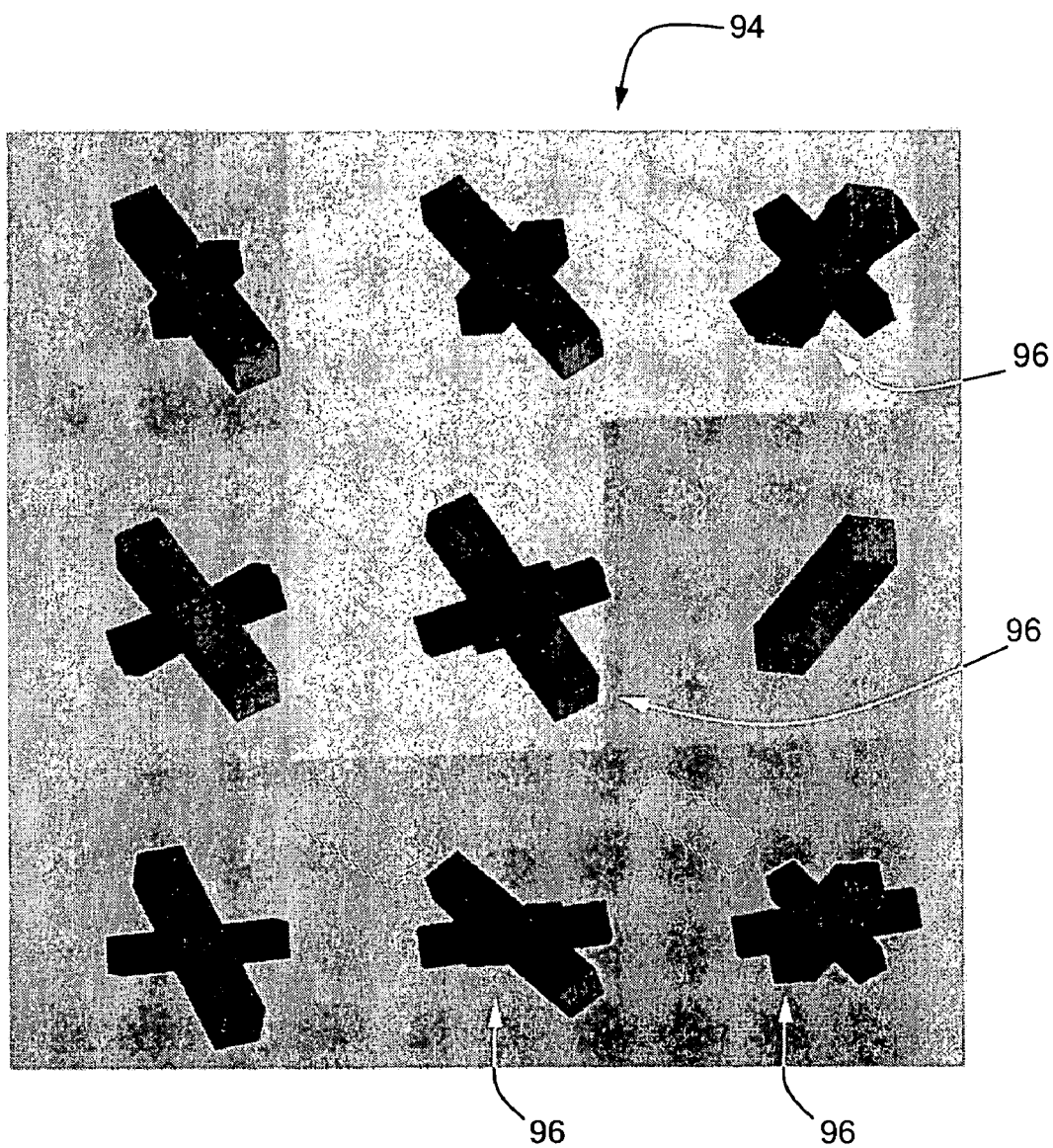
FIG. 8 shows an enlarged view of a portion of the cuboid field shown in FIG. 7B.

The three-way crossing between the SLF, the CC and the CR (of a ROI indicated in FIG. 7B by reference numeral 94) is shown in greater detail in FIG. 8. Cuboids 96 show a three-way intersection between the SLF, the CR and the striations of the CC. The projections of the SLF can be seen to extend as far superior as the level of the PCL. The fanning projections from the CC to the PrCG and PoCG are clearly resolved.

In contrast, on the DTI (as shown in FIG. 7A), the striations of the CC are obscured by the ascending CR. In the absence of the CC projections, the PrCG and PoCG appear to receive no inputs.

Figure 9:
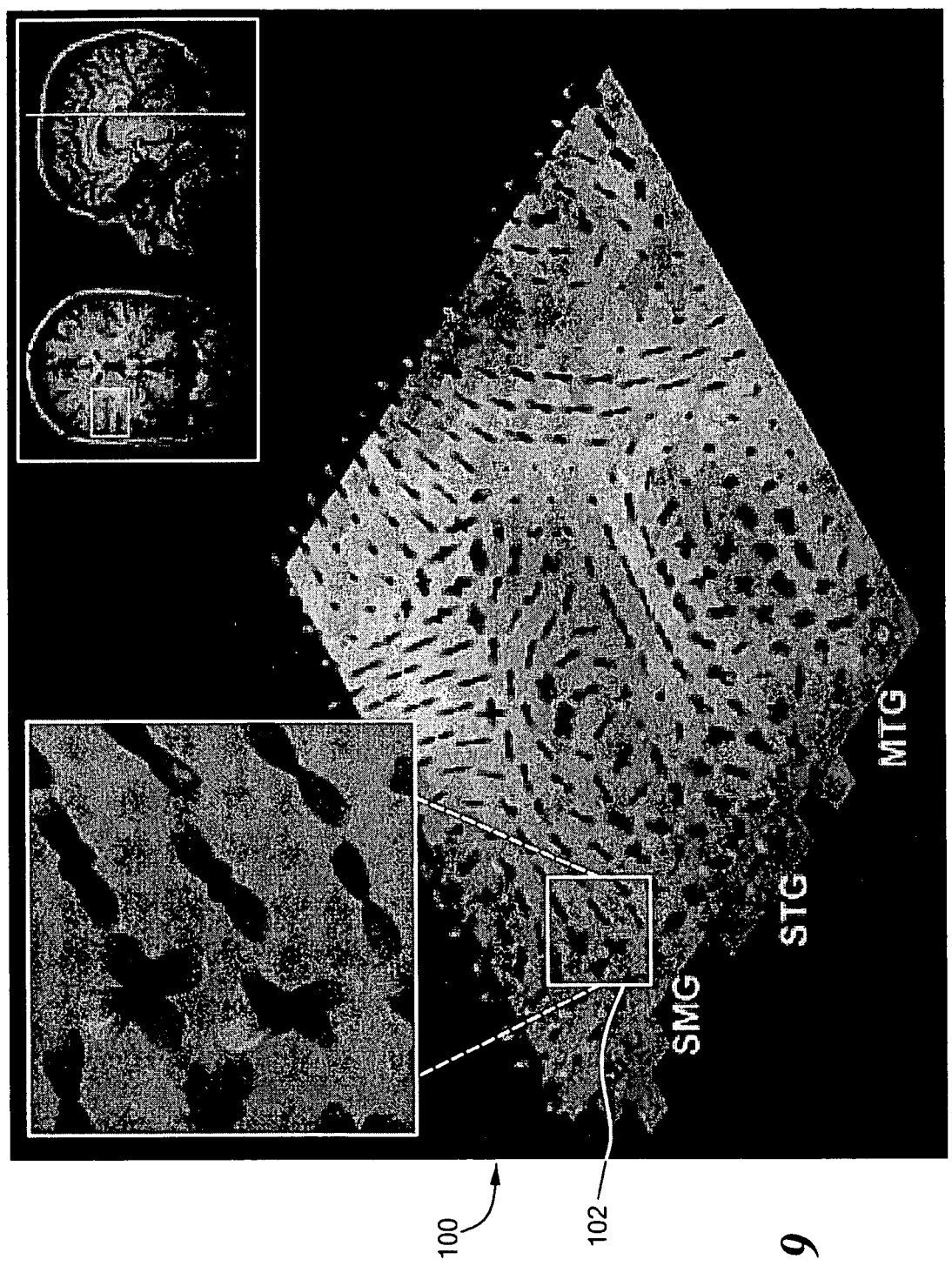
FIG. 9 shows a coronal diffusion ODF map of the temporal lobe generated from the sum of low frequency and high frequency QBI acquisitions.

In addition to resolving fiber crossing in deep white matter intersections, QBI was able to resolve composite fiber architecture at the cortical margin. FIG. 9 shows a coronal ODF map of a right temporal lobe, indicated by reference numeral 100. The map 100 was generated from the mean of the low frequency and high frequency QBI acquisitions. Composite fiber structure is seen at the crown of the supramarginal gyrus (SMG) and to a lesser extent at the crown of the superior temporal gyrus (STG). Complex structure is also observed along the walls of SMG and STG. Along the gyral wall, the fiber directions are oriented approximately normal and parallel to the cortical surface. For both gyri the surface-normal fiber component is oriented in the superior-inferior direction.

A ROI and anterior-posterior level are shown in the structural images at top right. A ROI 102 at the crown of the SMG (and shown in greater detail in the insert at top left) shows the crossing between the white matter insertion (mediolateral) to the gyral crown and a putative intracortical fiber population oriented in the anteroposterior direction. The gyri identified as "MTG" are the middle temporal gyrus.

As mentioned earlier, the peaks of the ODFs may be color-coded according to their direction with red indicating mediolateral, green anteroposterior and blue superoinferior. The brightness may be scaled by the height of the peak.

The anteroposterior mediolateral diffusion component reflects the insertion to the gyral crown. The anteroposterior diffusion component oriented normal to the cortical surface is attributed to the white matter insertions to cortex. The fibers bend rapidly and therefore the curvature of the fibers cannot be resolved. The characteristic cross-hatched fiber structure at the gyral wall is also seen in the QBI in FIG. 7B in the cingulate gyrus and the PrCG. The cross-hatched pattern is attributed to partial volume between the ascending projections to gyral crown and the insertions to the gyral wall.

Alternatively, the surface-normal diffusion component may be due to radially organized gray matter. To determine whether the surface-normal diffusion component originates from white matter or gray matter, it would be helpful to obtain QBI with high enough spatial resolution to resolve pure gray matter voxels. Another approach would be to measure an MR property of the surface-normal diffusion compartment, such as the T1 or T2 relaxation constant. Based on the measured parameter, the surface-normal component could then be assigned to white matter or gray matter.

Thus, as discussed, QBI can resolve complex intravoxel white matter fiber structure including fiber crossing in deep white matter, and composite fiber structure at the cortical margin. The ability to resolve intravoxel fiber crossing will significantly benefit efforts to trace neural pathways with diffusion MRI. For example, the ability to resolve the intersection between the callosal striations and the CR demonstrated in FIG. 7B (and FIG. 8) will allow for more accurate tractography of the callosal projections. Additionally, the resolution of the insertions into cortex will help track fibers to specific locations within a gyrus.

To obtain accurate tract reconstructions from diffusion imaging, the exact relationship between the measured diffusion function and the underlying fiber geometry needs to be understood. Although QBI describes the fiber structure through the diffusion ODF, there are multiple fiber arrangements consistent with a particular ODF. Consider an ODF with two peaks (×). The underlying fiber structure may consist of crossing fibers (×) or neighboring kinking fibers ()(, also called 'kissing' fibers. Due to the reflection symmetry of the ODF, the fiber structure could also be a single bending fiber with one of four possible orientations (), ⟨, ˆ, or ∨).

Characteristics of the ODF peaks themselves could provide clues to distinguish these possibilities. In some cases, a crossing fiber arrangement can be distinguished from a kissing fiber pattern based on characteristics of the ODF peaks. For example, if one of the ODF peaks is significantly wider or longer than the other peak then that would suggest a crossing fiber arrangement rather than a kissing fiber pattern. For a kissing fiber pattern, the ODF peaks would be more similar. Corresponding peaks can also be matched using other characteristics of the ODF peaks such as MR relaxation properties including T2 or magnetization transfer. The ODFs from the neighboring voxels can also provide discriminating information. If an ODF peak at a particular voxel is consistent with the ODF peaks leading to and from that voxel that would suggest that the peaks are connected.

For the purposes of connectivity reconstructions, it is noted that the measured diffusion ODF does not reflect the true fiber ODF. The tractography reconstructions would ideally be performed with the fiber ODF if it could be determined. In the streamline solutions commonly used in tensor-based tractography the fiber probability distribution is implicitly taken as a δ-function around the principal eigenvector. Developing a physically more accurate model of the fiber distribution would greatly improve the anatomical accuracy of tractography reconstructions.

The relationship between the diffusion ODF and the fiber ODF is governed by the diffusion physics and biophysical properties of the tissue such as the cell membrane permeability and the free diffusion coefficients for the cellular compartments. To the extent that the imaging physics and the diffusion properties of neural tissue are known, a forward model can be formulated to relate the fiber ODF to the diffusion ODF. Inverting the forward model would then give an estimate for the fiber ODF based on the measured diffusion ODF. In addition to providing a more accurate estimate for the fiber distribution, solving for the fiber ODF would yield a sharper ODF since the dispersion effects of the diffusion process would be reduced or eliminated.

The ODF peaks can also be sharpened experimentally by tuning the diffusion wavevector to optimize the angular contrast-to-noise ratio. The optimal wavevector will depend on the diffusion characteristics of the tissue, including the diffusion anisotropy of the target fiber population, and the angular separation of the individual populations. The optimal diffusion wavevector will also vary in neurodegenerative states which alter the diffusion environment.

Optimization of the sampling scheme may allow for significant improvements in the total acquisition time. For example, a research protocol which acquires a whole-head volume in approximately 35 minutes, by sampling 252 directions, corresponding to ~12° angular resolution, could be used. The 252 sampling directions requires approximately the same acquisition time as a 7-direction DTI scan with 36 averages. Rather than a single sampling shell, the optimal sampling scheme may consist of multiple shells each acquired with different wavevector (as discussed earlier).

DTI has been applied widely to map group effects related to changes in white matter microstructure. Group statistics can also be calculated from the ODF maps based on either parameters derived from the ODF or on the whole ODF per se. The ODF group statistics can be calculated using tools developed for spherical statistics, which is a well-developed field of statistics.

Relative to the diffusion tensor, the ODF offers a more complete and more accurate representation of the true diffusion function. ODF maps will therefore help in the interpretation of diffusion contrast, both at the individual and group levels. To cite one example, under the diffusion tensor model, neurodegeneration can lead to either a decrease or an increase in FA depending on whether or not the region contains fiber crossing. The ODF can determine whether an observed reduction in anisotropy is due to a reduction in anisotropy in a single fiber population or increased orientational heterogeneity. Ultimately, the model-independence and the resolving power of the ODF framework will help elucidate the fundamental biophysical mechanisms governing diffusion anisotropy in nerve tissue, and provide a more accurate basis for inferring neural connectivity from diffusion-weighted imaging.

In sum, in the above-described method for sampling and reconstructing the spin displacement ODF directly on a sphere, the reconstruction is based on the FRT and yields an ODF which functionally closely resembles the diffusion ODF obtained by explicit radial projection of the Cartesian diffusion function. However, given the ability of the spherical sampling scheme to directly target a spatial frequency band where the angular contrast-to-noise is greater, the spherical reconstruction scheme affords significantly greater complexity sensitivity than the Cartesian Fourier reconstruction. The experimental results discussed herein served to demonstrate the greater complexity sensitivity of the q-ball technique relative to the DSI technique.

The greater complexity sensitivity exhibited by the high spatial frequency QBI acquisition relative to the lower spatial frequency acquisition indicates that there exists a spatial frequency which will optimize the complexity sensitivity. It may be desirable to investigate the complexity sensitivity as a function of spatial frequency, i.e., the radius of the q-ball. As the optimal spatial frequency will be a function of the underlying diffusion, the optimal spatial frequency may differ for white and gray matter. Hence, the radius of the q-ball may be specified based on the anatomical target.

The angular resolution, and consequently the complexity sensitivity, of the QBI acquisition is determined by the radius of the q-ball. Consequently, by obtaining acquisitions with multiple radii it may be possible to design filters with sharper angular resolution. Ideally, the multiplication kernel should be a delta-function, in which case the q-ball acquisition will be theoretically identical to the radial projection transform of the Cartesian diffusion function.

The sensitivity of the QBI technique to complex structure is determined by the radius of the reciprocal space sphere, which also affects the signal-to-noise. Given the inherent trade-off between signal-to-noise and voxel resolution, it is desirable to determine the optimal trade-off between angular and spatial resolution for resolving a particular anatomical structure of interest. In addition, the analytical framework provided by the QBI technique provides a basis for designing and interpreting experiments and tests using multiple sampling shells. In particular, is possible to design projection kernels with desired trade-off properties by combining multiple sampling shells.

The QBI technique thus provides a novel diffusion MRI method for resolving microscopic tissue structure within a single voxel. It increases the efficiency and sensitivity of diffusion MRI. Most notably, the QBI technique can measure complex tissue structure within a single imaging pixel, in scan times that are clinically feasible. The gains in efficiency and sensitivity are due to sampling the diffusion function on the surface of a spherical shell (instead of sampling over an entire cubical volume, as in conventional techniques). In practice, the efficiency gain is approximately a factor of four in scanning time. The QBI technique is at least a factor of four more efficient than conventional Fourier diffusion imaging methods, and has better signal-to-noise and sensitivity profiles. Potential applications for the QBI technique include clinical applications, drug efficacy imaging, as well as imaging of stroke, cancer, infiltration, brain trauma and neurological disorders.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the disclosed concepts. All publications and references cited herein are expressly incorporated herein by reference in their entirety.

What is claimed is:

1. A method of imaging comprising:
   receiving magnetic field gradient directions specified for an MRI scan of a microscopic structure;
   generating images for each magnetic field gradient direction;
   collecting pixel information from the generated images for a given pixel of interest;
   assembling the pixel data onto a surface of at least one sphere; and
   determining properties of a diffusion function on the at least one sphere by transforming the pixel data assembled onto the surface of the at least one sphere using a spherical transform.

2. The method of claim 1 further comprising:
   repeating the steps of collecting, assembling and calculating for each additional pixel of interest.

3. The method of claim 2 further comprising:
   displaying results of the diffusion function properties determination.

4. The method of claim 1 wherein the properties of the diffusion function on the at least one sphere comprise an orientation distribution function (ODF).

5. The method of claim 4 wherein determining comprises:
   if the at least one sphere comprises multiple spheres, adding corresponding pixel data assembled on surfaces of the multiple spheres to produce pixel data for one sphere;
   selecting a direction through such sphere;
   identifying the major circle for the selected direction;
   computing pixel values on the major circle by interpolating the pixel data on the sphere;
   calculating an ODF value for the selected direction by adding the pixel values on the major circle;
   determining if other directions are to be selected; and
   if other directions are to be selected, repeating the steps of selecting, identifying, computing and calculating for each of the other directions.

6. The method of claim 5 wherein interpolating the pixel data on the sphere comprises using a Parzen window interpolation.

7. The method of claim 5 wherein determining comprises:
   rendering the ODF values as a spherical polar plot.

8. The method of claim 1 wherein the spherical transform comprises a Funk-Radon transform.

9. The method of claim 1 wherein the radius of the at least one sphere is chosen according to a length scale of interest.

10. The method of claim 1 wherein the microscopic structure comprises a microscopic tissue structure.

11. An article comprising:
    a storage medium having stored thereon instructions that when executed by a machine result in the following:
    obtaining images of a microscopic structure for different magnetic field gradient directions;
    collecting pixel information from the images for a given pixel of interest;
    assembling the pixel data onto a surface of at least one sphere; and
    determining properties of a diffusion function on the at least one sphere by transforming the pixel data assembled onto the surface of the at least one sphere using a spherical transform.

12. The article of claim 11 wherein the instructions further comprise instructions that when executed by a machine result in the following:
    repeating the steps of collecting, assembling and calculating for each additional pixel of interest.

13. The article of claim 12 wherein the instructions further comprise instructions that when executed by a machine result in the following:
    displaying results of the diffusion function properties determination.

14. The article of claim 11 wherein properties of the diffusion function on the at least one sphere comprise an orientation distribution function (ODF).

15. The article of claim 14 wherein determining comprises:
    if the at least one sphere comprises multiple spheres, adding corresponding pixel data assembled on surfaces of the multiple spheres to produce pixel data for one sphere;
    selecting a direction through such sphere;
    identifying the major circle for the selected direction;
    computing pixel values on the major circle by interpolating the pixel data on the sphere;
    calculating an ODF value for the selected direction by adding the pixel values on the major circle;
    determining if other directions are to be selected; and
    if other directions are to be selected, repeating the steps of selecting, identifying, computing and calculating for each of the other directions.

16. The article of claim 15 wherein determining further comprises:
    rendering the ODF values as a spherical polar plot.

17. The article of claim 11 wherein the spherical transform comprises a Funk-Radon transform.

18. The article of claim 11 wherein the radius of the at least one sphere is chosen according to a length scale of interest.

19. The article of claim 11 wherein the microscopic structure comprises a microscopic tissue structure.

20. A system comprising:
    an interface adapted to receive magnetic field gradient directions specified by a user for an MRI of a microscopic structure;
    a controller, coupled to the user interface and an MRI scanner, operative to control the MRI scanner to generate images of the microscopic structure for each magnetic field gradient direction; and
    a processor, coupled to the controller, configured to collect pixel information from the generated images for a given pixel of interest, assemble the pixel data onto a surface of at least one sphere and determine properties of a diffusion function on the at least one sphere by transforming the pixel data assembled onto the surface of the at least one sphere using a spherical transform.

21. The system of claim 20 wherein the properties of the diffusion function on the at least one sphere comprise an orientation distribution function (ODF).

22. The system of claim 20 wherein the spherical transform comprises a Funk-Radon transform.

23. The system of claim 20 wherein the radius of the at least one sphere is chosen according to a length scale of interest.

* * * * *

UNITED STATES PATENT AND TRADEMARK OFFICE
CERTIFICATE OF CORRECTION

PATENT NO.         : 7,034,531 B1                                      Page 1 of 1
APPLICATION NO.    : 10/754481
DATED              : April 25, 2006
INVENTOR(S)        : Tuch et al.

It is certified that error appears in the above-identified patent and that said Letters Patent is hereby corrected as shown below:

Column 3, line 62 delete "time r." and replace with --time τ.--.

Column 8, line 42 delete "as" and replace with --as:--.

Column 10, line 8 delete "$b^{max}$" and replace with --$b_{max}$--.

Column 13, lines 2-3 delete "( ), ⟨, ^, or ∨ )." and replace with --( ), ⟨, ∧, or ∨ ).--.

Column 14, line 61 delete "In particular, is possible" and replace with --In particular, it is possible--.

Column 15, line 17 delete "submitted that that the" and replace with --submitted that the--.

Signed and Sealed this

Fifteenth Day of April, 2008

JON W. DUDAS
*Director of the United States Patent and Trademark Office*